United States Patent
Igarashi et al.

(10) Patent No.: US 11,222,780 B2
(45) Date of Patent: Jan. 11, 2022

(54) METHOD FOR EVALUATING SILICON WAFER AND METHOD FOR MANUFACTURING SILICON WAFER

(71) Applicant: SHIN-ETSU HANDOTAI CO., LTD., Tokyo (JP)

(72) Inventors: Kensaku Igarashi, Nishigo-mura (JP); Tatsuo Abe, Shirakawa (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 163 days.

(21) Appl. No.: 16/642,194

(22) PCT Filed: Aug. 20, 2018

(86) PCT No.: PCT/JP2018/030614
§ 371 (c)(1),
(2) Date: Feb. 26, 2020

(87) PCT Pub. No.: WO2019/049641
PCT Pub. Date: Mar. 14, 2019

(65) Prior Publication Data
US 2020/0203233 A1 Jun. 25, 2020

(30) Foreign Application Priority Data

Sep. 6, 2017 (JP) .............................. JP2017-171164
Apr. 18, 2018 (JP) .............................. JP2018-079891

(51) Int. Cl.
*H01L 21/02* (2006.01)
*H01L 21/66* (2006.01)
*B08B 3/08* (2006.01)

(52) U.S. Cl.
CPC .......... *H01L 21/02052* (2013.01); *B08B 3/08* (2013.01); *H01L 22/20* (2013.01); *B08B 2203/005* (2013.01)

(58) Field of Classification Search
None
See application file for complete search history.

(56) References Cited

U.S. PATENT DOCUMENTS

2014/0048100 A1  2/2014  Abe et al.

FOREIGN PATENT DOCUMENTS

| JP | 2000-208578 A | 7/2000 |
| JP | 2002-353281 A | 12/2002 |

(Continued)

OTHER PUBLICATIONS

Nov. 6, 2018 Search Report issued in International Patent Application No. PCT/JP2018/030614.

*Primary Examiner* — Mikhail Kornakov
*Assistant Examiner* — Ryan L Coleman
(74) *Attorney, Agent, or Firm* — Oliff PLC

(57) ABSTRACT

A method for evaluating a silicon wafer, including: a pre surface defect measuring step for performing a surface defect measurement on the silicon wafer in advance, a cleaning step of alternately repeating on the silicon wafer an oxidation treatment by ozone water and an oxide film removal treatment by hydrofluoric acid under a condition of not completely removing an oxide film formed on a surface of the silicon wafer, and an incremental defect measuring step of performing a surface defect measurement on the silicon wafer after the cleaning step and measuring incremental defects that increased relative to defects measured in the pre surface defect measuring step, wherein the cleaning step and the incremental defect measuring step are alternately performed repeatedly multiple times and the silicon wafer is evaluated based on a measurement result of the incremental defects after each cleaning step.

17 Claims, 2 Drawing Sheets

(56) References Cited

FOREIGN PATENT DOCUMENTS

| | | |
|---|---|---|
| JP | 2003-270169 A | 9/2003 |
| JP | 2013-004760 A | 1/2013 |
| JP | 2017-219409 A | 12/2017 |
| WO | 2012/172724 A1 | 12/2012 |

[FIG. 1]
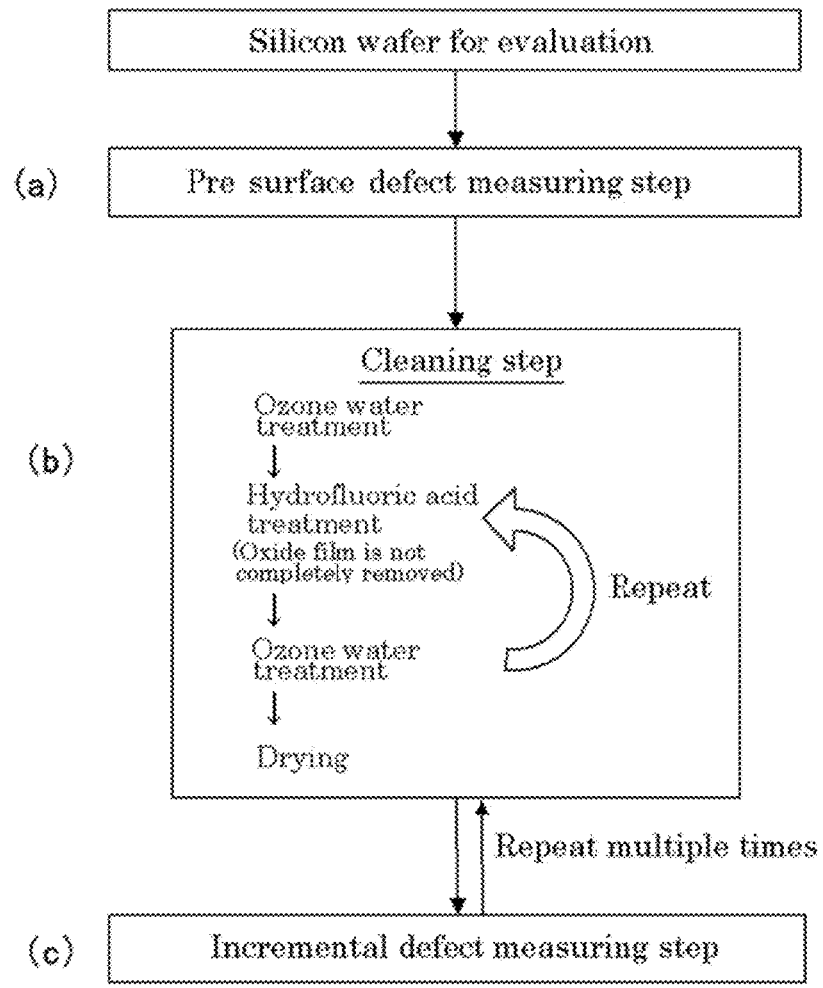
[FIG. 2]
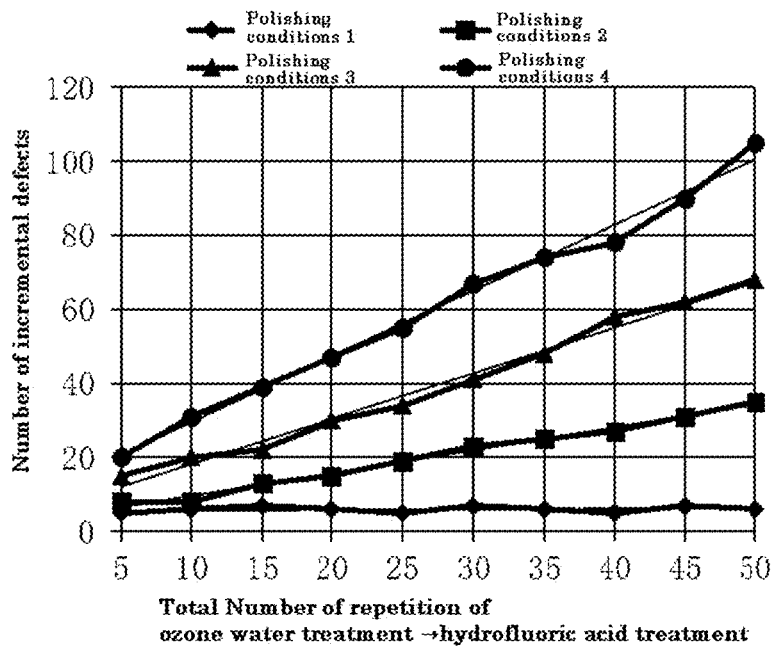

[FIG. 3]
(A)
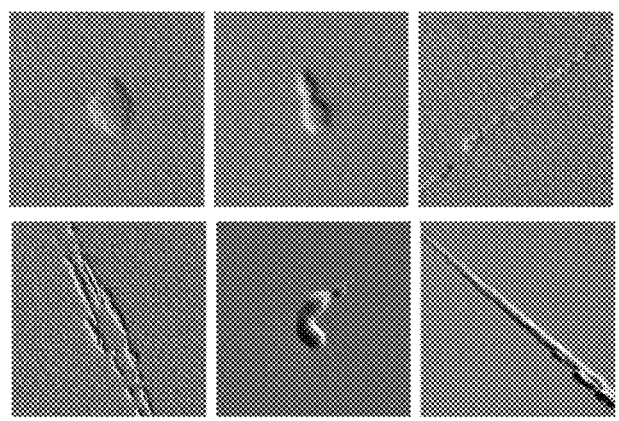
(B)
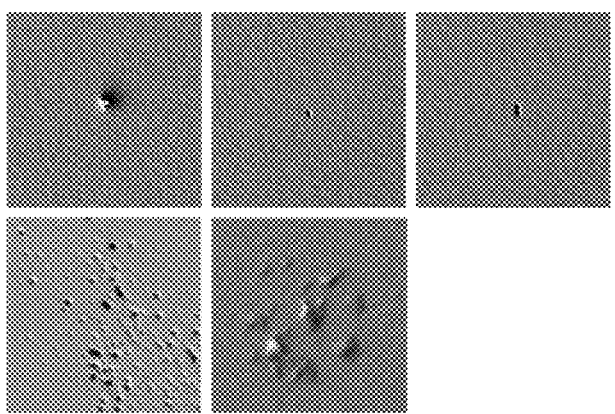

METHOD FOR EVALUATING SILICON WAFER AND METHOD FOR MANUFACTURING SILICON WAFER

TECHNICAL FIELD

The present invention relates to a method for evaluating a silicon wafer and a method for manufacturing a silicon wafer.

BACKGROUND ART

Wafer quality after polishing is improving daily, and on observing the quality of a wafer after polish-cleaning, it is becoming difficult to discern whether an observed abnormality is due to polishing, cleaning, or crystal.

Presently, for evaluating the quality of a polishing state, the only method is to polish a large quantity of wafers and follow the trend in quality, and since the difference in quality changes with various external factors, evaluation is difficult. In addition, conventionally, a wafer after polishing is only measured once, and in manufacturing a vast quantity of wafers, it has been extremely difficult to detect abnormality in polishing quality even if a sampling inspection is conducted as is conventional. Moreover, it is often already too late at the stage when an abnormal value can be clearly observed.

As a conventionally existing method for evaluating surface quality, there is the SC1-RT method, but this is a method for evaluating defects due to silicon crystal or metallic contamination and not a method for evaluating defects due to processing such as polishing (processing defects) (Patent Document 1).

In addition, since the SC1-RT method uses aqueous alkaline solution, which etches both Si and $SiO_2$ theoretically, degradation of wafer surface roughness is considerable.

In addition, the conventional method for evaluating the quality of a wafer by ozone water and HF treatment includes a step of removing (delaminating) all the natural oxide film (Patent Document 2), and if a complete removal of the oxide film is thus performed, defects due to crystal become actualized, and it was not possible to evaluate defects due to processing such as polishing.

CITATION LIST

Patent Literature

Patent Document 1: Japanese Unexamined Patent Application Publication No. 2002-353281
Patent Document 1: Japanese Unexamined Patent Application Publication No. 2013-004760

SUMMARY OF INVENTION

Technical Problem

The present invention has been made in view of the above-described problem, and an object thereof is to provide a method for evaluating a silicon wafer in which it is possible to evaluate only defects due to processing such as polishing, excluding defects due to crystal and particles, etc. generated while cleaning, etc.

Solution to Problem

To solve the above problem, the present invention provides a method for evaluating a silicon wafer, including:

a pre surface defect measuring step for performing a surface defect measurement on the silicon wafer in advance, a cleaning step of alternately repeating on the silicon wafer an oxidation treatment by ozone water and an oxide film removal treatment by hydrofluoric acid under a condition of not completely removing an oxide film formed on a surface of the silicon wafer, and an incremental defect measuring step of performing a surface defect measurement on the silicon wafer after the cleaning step and measuring incremental defects that increased relative to defects measured in the pre surface defect measuring step, wherein the cleaning step and the incremental defect measuring step are alternately performed repeatedly multiple times and the silicon wafer is evaluated based on a measurement result of the incremental defects after each cleaning step.

Such a method for evaluating a silicon wafer makes it possible to actualize only processing defects without actualizing defects due to crystal in the cleaning step, and by observing the increase tendency of the incremental defects measured after each cleaning step, it is possible to evaluate only processing defects, excluding defects due to crystal and particles, etc. generated while cleaning, etc., and the quality of processing such as polishing can be evaluated.

In addition, in this case, the oxide film removal treatment by hydrofluoric acid under the condition of not completely removing the oxide film is preferably performed with a hydrofluoric acid concentration of 0.1 to 1.0% and a treatment time of 2 seconds to 20 seconds.

Since it is possible to control natural oxide film thickness with such an oxide film removal treatment by hydrofluoric acid, it is possible to perform the oxide film removal without completely removing the oxide film with more certainty.

In addition, in this case, the cleaning step is preferably performed by repeating the oxidation treatment by ozone water and the oxide film removal treatment by hydrofluoric acid alternately 5 times or more.

In this way, by repeating the oxidation treatment by ozone water and the oxide film removal treatment by hydrofluoric acid 5 times or more, it is possible to actualize processing defects with certainty, and therefore, it is possible to evaluate processing quality more accurately.

In addition, in this case, as the silicon wafer, a mirror-polished wafer is preferably used.

In the inventive method for evaluating a silicon wafer, by using a mirror-polished silicon wafer, polishing quality can be evaluated.

In addition, in the inventive method for evaluating a silicon wafer, defects of the silicon wafer due to processing can be evaluated based on a measurement result of the incremental defects after each of the cleaning steps.

In the inventive method for evaluating a silicon wafer, it is possible to actualize only defects due to processing such as polishing in the cleaning step, and by observing the increase tendency of the incremental defects measured after each cleaning step, it is possible to evaluate only defects due to processing, and therefore, it is possible to evaluate processing quality.

In addition, the present invention provides a method for manufacturing a silicon wafer that is to become a product by performing mirror-polishing on a silicon wafer before mirror-polishing, including:

a step of preparing an experimental silicon wafer before mirror-polishing, a step of performing mirror-polishing on the experimental silicon wafer before mirror-polishing under prescribed mirror-polishing conditions, a pre surface defect measuring step for performing a surface defect measurement on the experimental silicon wafer in advance, a cleaning step of alternately repeating on the experimental silicon wafer an oxidation treatment by ozone water and an oxide film removal treatment by hydrofluoric acid under a condition of not completely removing an oxide film formed on a surface of the experimental silicon wafer, and an incremental defect measuring step of performing a surface defect measurement on the experimental silicon wafer after the cleaning step and measuring incremental defects that increased relative to defects measured in the pre surface defect measuring step, wherein the cleaning step and the incremental defect measuring step are alternately performed repeatedly multiple times and the experimental silicon wafer is evaluated based on a measurement result of the incremental defects after each cleaning step, on the basis of the evaluation of the experimental silicon wafer, mirror-polishing conditions of the mirror-polishing wherein polishing quality after performing mirror-polishing on the silicon wafer before mirror-polishing is a desired polishing quality are specified, and the silicon wafer that is to become a product is manufactured by performing mirror-polishing on the silicon wafer before mirror-polishing under the specified mirror-polishing conditions.

Such a method for manufacturing a silicon wafer makes it possible to actualize only processing defects without actualizing defects due to crystal in the cleaning step, and by observing the increase tendency of the incremental defects measured after each cleaning step, it is possible to evaluate only processing defects, excluding defects due to crystal and particles, etc. generated while cleaning, etc., regarding the experimental silicon wafer. This experiment makes it possible to specify under what mirror-polishing conditions the mirror-polishing should be performed on the silicon wafer before mirror-polishing to obtain a desired polishing quality. By manufacturing a silicon wafer under the mirror-polishing conditions specified in this way, it is possible to manufacture a mirror-polished silicon wafer of a desired polishing quality.

Advantageous Effects of Invention

In the inventive method for evaluating a silicon wafer, it is possible to actualize only processing defects without actualizing defects due to crystal in the cleaning step, and in addition, by observing the increase tendency of the incremental defects measured after each cleaning step, it is possible to evaluate only processing defects due to polishing, etc., excluding defects due to crystal and particles, etc. generated while cleaning, etc. In addition, in the present invention, it is possible to perform the cleaning without degrading the surface roughness of the wafer, and measurement at a minute particle size is possible. In addition, in the inventive method for manufacturing a silicon wafer, by specifying mirror-polishing conditions on the basis of the evaluation of the experimental silicon wafer whose processing defects only were evaluated, it is possible to manufacture a mirror-polished silicon wafer of a desired polishing quality.

BRIEF DESCRIPTION OF DRAWINGS

FIG. 1 is a step flow diagram showing an embodiment of the inventive method for evaluating a silicon wafer.

FIG. 2 is a graph showing the relationship between the total number of repetition of treatment by ozone water→treatment by hydrofluoric acid in the Example and the number of incremental defects.

FIG. 3 (A) shows SEM images of a wafer surface observed after cleaning in the Example, and (B) shows SEM images of defects detected in the Comparative Example.

DESCRIPTION OF EMBODIMENTS

As stated above, in a conventional method for evaluating a silicon wafer, defects due to crystal become actualized, and it has not been possible to evaluate defects due to processing such as polishing.

Accordingly, in order to solve the above problems, the present inventors have keenly studied and found that by alternately repeating multiple times a cleaning step of alternately repeating an oxidation treatment by ozone water and an oxide film removal treatment by hydrofluoric acid under a condition of not completely removing an oxide film formed on a surface of the silicon wafer and an incremental defect measuring step of performing a surface defect measurement on the silicon wafer after the cleaning step and measuring incremental defects that increased relative to defects measured in the pre surface defect measuring step and by evaluating the silicon wafer on the basis of a measurement result of the incremental defects after each cleaning step, it is possible to actualize only defects due to processing without actualizing defects due to crystal in the cleaning step and it is possible to evaluate only defects due to processing such as polishing, and arrived at the present invention.

That is, the present invention provides a method for evaluating a silicon wafer, including:

a pre surface defect measuring step for performing a surface defect measurement on the silicon wafer in advance, a cleaning step of alternately repeating on the silicon wafer an oxidation treatment by ozone water and an oxide film removal treatment by hydrofluoric acid under a condition of not completely removing an oxide film formed on a surface of the silicon wafer, and an incremental defect measuring step of performing a surface defect measurement on the silicon wafer after the cleaning step and measuring incremental defects that increased relative to defects measured in the pre surface defect measuring step, wherein the cleaning step and the incremental defect measuring step are alternately performed repeatedly multiple times and the silicon wafer is evaluated based on a measurement result of the incremental defects after each cleaning step.

Hereinafter, the inventive method for evaluating a silicon wafer will be described. FIG. 1 is a step flow diagram showing an embodiment of the inventive method for evaluating a silicon wafer.

As a silicon wafer to be evaluated, there is no particular limitation, but a mirror-polished silicon wafer is preferable. Using a mirror-polished silicon wafer, it is possible to evaluate defects due to polishing such as PID (Polishing Induced Defect) and polishing quality can be evaluated.

Firstly, a pre surface defect measuring step for performing a surface defect measurement in advance is performed on the silicon wafer to be evaluated (FIG. 1(a)). For example, the step can be performed using a Surfscan SP5 manufactured by KLA-Tencor. Since there are hardly any processing defects with a size over 40 nm, it is sufficient for the measured size to be 40 nm or less.

Next, a cleaning step of alternately repeating an oxidation treatment by ozone water and an oxide film removal treatment by hydrofluoric acid under a condition of not completely removing an oxide film formed on a surface of the silicon wafer is performed (FIG. 1(b)). This cleaning step is preferably performed in a single-wafer-type cleaning apparatus.

The cleaning step (b) is a step for actualizing defects due to processing such as polishing. By performing an oxide film removal by hydrofluoric acid without completely removing the oxide film and a reoxidation of the wafer surface by ozone water, it is possible to actualize only defects due to processing such as polishing without actualizing defects due to crystal. With the conventional SC1-RT method (for example, Japanese Unexamined Patent Application Publication No. 2000-208578) or a conventional method for evaluating the quality of a wafer by ozone water and HF treatment, it is not possible to evaluate defects due to processing such as polishing, but with the present invention, by performing cleaning with repetition using ozone water and hydrofluoric acid without completely removing the oxide film, it is possible to actualize and evaluate only defects due to processing without actualizing defects due to crystal. In addition, it is possible to perform the cleaning without degrading the surface roughness of the wafer, and measurement at a minute particle size is possible.

By actualizing only defects due to processing such as polishing in this way, it is possible to evaluate only processing defects.

Incidentally, the reason why only defects due to processing such as polishing can be actualized without actualizing defects due to crystal in the cleaning step (b) in the present invention is as follows. Regarding processing defects, damage occurs in the wafer at the time of processing such as polishing and becomes a damaged layer. The oxide film of the wafer is removed by hydrofluoric acid, but the oxide film on the part of the mechanically damaged layer has a different etching rate from the surrounding oxide film, which is made apparent by alternately repeating the treatment by ozone water and the treatment by hydrofluoric acid. This is because, by performing an etching treatment by hydrofluoric acid in which the oxide film remains, a difference occurs in the oxide film thickness in the mechanically damaged layer and the surrounding portion (the oxide film in the part of the mechanically damaged layer is thick), and by repeating the treatment of re-forming an oxide film (make the oxide film thickness uniform again) by ozone water, the difference becomes more marked. If the oxide film is completely removed, the part of the oxide film on the mechanically damaged layer is also removed. Therefore, even if the ozone water treatment and the hydrofluoric acid treatment are repeated, no difference occurs in oxide film thickness since there is no oxide film, and no actualizing occurs, and it becomes impossible to evaluate defects due to processing.

In addition, by keeping the etching amount low and constantly leaving some oxide film by repeating the ozone water and hydrofluoric acid treatments without completely removing the oxide film as in the present invention, crystal defects such as oxide precipitates or defects such as pits due to metallic contamination are not actualized.

On the other hand, in the conventional SC1-RT method, in the actualizing due to performing a considerable amount of etching, not only processing defects but also crystal defects such as oxide precipitates are actualized.

The conventional method for evaluating the quality of a wafer by ozone water and HF treatment includes a step of removing (delaminating) all the natural oxide film. Although it is possible to evaluate without degrading surface roughness by completely removing the oxide film using ozone water and hydrofluoric acid, with this method, crystal defects are also actualized when removing the natural oxide film with HF.

The ozone concentration of the ozone water in the present invention is not particularly limited, but 5 ppm to 30 ppm is preferable. 5 ppm or more is preferable for producing a natural oxide film, and from the perspective of substantial effective concentration, 30 ppm or less is preferable. In addition, the time for each treatment by ozone water is, for producing a natural oxide film, preferably 10 seconds or more.

The hydrofluoric acid concentration is not particularly limited, but 0.1 to 1.0% is preferable. With 0.1% or more, it is preferable since the concentration can be controlled accurately. In addition, for controlling the film thickness of the natural oxide film, 1.0% or less is preferable. In addition, each hydrofluoric acid treatment time is preferably approximately 2 seconds to 20 seconds. With 2 seconds or more, the hydrofluoric acid supplied to the wafer is spread, and with 20 seconds or less, it is possible to perform the oxide film removal treatment, leaving some oxide film with certainty, and therefore, it is preferable.

The number of repeats of the oxidation treatment by ozone water and the oxide film removal treatment by hydrofluoric acid is preferably approximately 5 times to 50 times. When the number of repeats is 5 times or more, it is possible to actualize processing defects with certainty. In addition, when it is 50 times or less, cleaning step time can be reduced and throughput is raised, and therefore, it is preferable. Further, with 50 times or less, it is preferable since it is possible to evaluate without degrading the surface roughness of the silicon wafer. In addition, this is sufficient since it is possible to grasp the processing quality tendency of the wafer without repeating more than 50 times.

Next, an incremental defect measuring step (c) of performing a surface defect measurement on the silicon wafer after the cleaning step (b) and measuring incremental defects that increased relative to defects measured in the pre surface defect measuring step (a) is performed.

In this incremental defect measuring step (c), the number of only the defects that increased relative to defects measured in the pre surface defect measuring step (a) is measured. In the measurement, for example, by using a Surfscan SP5 manufactured by KLA-Tencor as in the pre surface defect measuring step and performing a same-coordinate measurement, it is possible to measure the increased number of only the defects that increased.

Subsequently, the cleaning step (b) and the incremental defect measuring step (c) are again performed. This is performed multiple times, and on the basis of the measurement result of the incremental defects after each cleaning step, for example, the increase tendency (inclination) of the incremental defects or the increased amount of incremental defects, the silicon wafer is evaluated.

In this way, by alternately performing the cleaning step (b) and the incremental defect measuring step (c) multiple times and evaluating the silicon wafer on the basis of the measurement result of the incremental defects (inclination of the incremental defects or the number of incremental defects), it is possible to evaluate only defects due to processing such as polishing, excluding defects due to crystal and particles, etc. generated while cleaning, etc.

In a wafer with favorable conditions of processing such as polishing, no (few) defects due to processing occur, and therefore, even when the cleaning step (b) and the incremental defect measuring step (c) are repeated, the inclination of the increase of the incremental defects is small, and the number of incremental defects is small. On the other hand, with a poor polish-processing quality, defects due to processing occur, and therefore, when the cleaning and the surface defect measurement are repeated, the inclination of the increase of the incremental defects becomes large, and the number of incremental defects becomes large. By evaluating the polish-processing quality on the basis of this inclination or the number of incremental defects, it is possible to observe the processing state at that point in time.

That is, when making a linear approximation of the incremental defects, the larger the inclination or the larger the number of incremental defects, latent processing defects are included, which means processing quality is poor.

As shown above, in the present invention, by repeatedly performing cleaning without completely removing the oxide film using ozone water and hydrofluoric acid, not only are degradation of the surface roughness of the wafer and adhesion of particles etc. suppressed, it is also possible to actualize only defects due to processing such as polishing without actualizing defects due to crystal. In addition, by observing the increase tendency of the incremental defects measured after each cleaning step, it is possible to evaluate only defects due to processing such as polishing, excluding defects due to crystal and particles, etc. generated while cleaning, etc. In addition, defect evaluation in a minute region has become possible which previously was not.

In addition, the above method for evaluating a silicon wafer can be applied to a method for manufacturing a silicon wafer that is to become a product by performing mirror-polishing on a silicon wafer before mirror-polishing. In this method for manufacturing a silicon wafer, before manufacturing the silicon wafer that is to become a product, the mirror-polishing conditions in the mirror-polishing are specified in advance by conducting an experiment on an experimental silicon wafer according to the above method for evaluating a silicon wafer, and the silicon wafer that is to become a product is manufactured by performing the mirror-polishing under the specified mirror-polishing conditions. Specifically, a silicon wafer is manufactured as described below.

Firstly, an experimental silicon wafer before mirror-polishing is prepared. Next, mirror-polishing is performed on this experimental silicon wafer before mirror-polishing under prescribed mirror-polishing conditions. On the experimental silicon wafer mirror-polished in this way, the pre surface defect measuring step, the cleaning step, and the incremental defect measuring step are performed as in the above method for evaluating a silicon wafer (see FIG. 1(a) to (c)). Specifically, each step is performed as follows. Firstly, a pre surface defect measuring step for performing a surface defect measurement in advance is performed on the mirror-polished experimental silicon wafer. Next, the cleaning step of alternately repeating an oxidation treatment by ozone water and an oxide film removal treatment by hydrofluoric acid under a condition of not completely removing an oxide film formed on a surface of the experimental silicon wafer is performed on the experimental silicon wafer. Next, the incremental defect measuring step of performing a surface defect measurement on the experimental silicon wafer after the cleaning step and measuring incremental defects that increased relative to defects measured in the pre surface defect measuring step is performed.

The above cleaning step and the incremental defect measuring step are alternately repeated multiple times and the experimental silicon wafer is evaluated on the basis of the measurement result of the incremental defects after each cleaning step. Further, on the basis of the evaluation of this experimental silicon wafer, mirror-polishing conditions of the mirror-polishing in which polishing quality after performing mirror-polishing on the silicon wafer before mirror-polishing is a desired polishing quality are specified. A silicon wafer that is to become a product by performing mirror-polishing on a silicon wafer before mirror-polishing is manufactured under the mirror-polishing conditions specified here.

With a mirror-polished silicon wafer which was polished under polishing conditions in which no (few) processing defects occur after mirror-polishing, the inclination of the increase of the incremental defects is small, and the number of incremental defects is small even when the cleaning step (b) and the incremental defect measuring step (c) are repeated. On the other hand, with a poor polish-processing quality, defects due to processing occur, and therefore, when the cleaning and the surface defect measurement are repeated, the inclination of the increase of the incremental defects becomes large, and the number of incremental defects becomes large. By evaluating the polish-processing quality on the basis of this inclination or the number of incremental defects in the experimental silicon wafer, it is possible to specify under what mirror-polishing conditions the mirror-polishing should be performed on the silicon wafer before mirror-polishing to obtain a desired polishing quality.

More specifically, it is possible to select mirror-polishing conditions such that, when making a linear approximation of the incremental defects, there is no inclination or the inclination is small. For example, in the flow shown in FIG. 1, the mirror-polishing conditions can be set so that the number of incremental defects has an average of 10 or less, 5 or less, or 1 or less for every 10 repeats of hydrofluoric acid—ozone water.

EXAMPLE

Hereinafter, the present invention will be more specifically described with reference to Examples and Comparative Examples, but the present invention is not limited to these Examples.

Example

A pre surface defect measurement was performed using silicon wafers that had been subjected to final polishing under different polishing conditions (polishing conditions 1 to 4) and finished being cleaned (FIG. 1(a)). Cleaning was performed on the wafer on which the pre surface defect measurement was performed by alternately repeating the oxidation treatment by ozone water and the oxide film removal treatment by hydrofluoric acid (FIG. 1(b)).

The cleaning was performed with the cleaning conditions set to: an ozone water concentration of 10 ppm, 20 seconds as each ozone water treatment time, a hydrofluoric acid concentration of 0.3%, 5 seconds as each hydrofluoric acid treatment time, and 5 as the number of repeats of hydrofluoric acid→ozone water in the flow shown in FIG. 1, and drying was performed subsequently. Note that in every hydrofluoric acid treatment, the oxide film removal was performed leaving a thickness on the wafer surface.

Next, a surface defect measurement was performed on the silicon wafer after the cleaning step and incremental defects that increased relative to defects measured in the pre surface defect measuring step (a) were measured (FIG. 1(c)). Note that the pre surface defect measurement and the incremental defect measurement were performed using a Surfscan SP5 manufactured by KLA-Tencor at a particle size of 19 nm or more, and by performing a same-coordinate measurement, only the incremental defects that were increased were measured.

The cleaning step and the incremental defect measuring step were repeated until the total number of repetition of treatment by ozone water→treatment by hydrofluoric acid became 50 (that is, until the number of repeats of the cleaning step and the incremental defect measuring step became 10).

With the number of only the defects that increased relative to the result of the pre surface defect measurement after each cleaning step as the number of incremental defects, the total number of repetition of treatment by ozone water→treatment by hydrofluoric acid and the number of incremental defects are summarized and shown in Table 1. In addition, a graph with the relationship between the total number of repetition of treatment by ozone water→treatment by hydrofluoric acid and the number of incremental defects plotted is shown in FIG. 2. On the basis of Table 1 and FIG. 2, the inclination of the increase of the incremental defects or the increased amount of defects was evaluated.

In addition, when the wafer surface after cleaning was observed by SEM it was revealed that no crystal defects were actualized on the wafer surface, and that only processing defects as shown in FIG. 3 (A) were actualized, and it was revealed that it was possible to evaluate processing quality.

As shown in FIG. 2, in the polishing conditions 1 to 4, the inclination of the increase of the incremental defects was different with each polishing condition, and since there is almost no inclination of the increase in the polishing conditions 1, it was revealed that no defects due to processing had occurred, that is, the polishing quality was favorable. In addition, in the polishing conditions 2 to 4, the greater the inclination of the increase, that is, in the order, polishing conditions 4, polishing conditions 3, polishing conditions 2, the worse the polishing quality.

TABLE 1

| Total number of repetition of ozone water treatment → hydrofluoric acid treatment | Number of defects that increased relative to pre surface defect measurement result | | | |
|---|---|---|---|---|
| | Polishing conditions 1 | Polishing conditions 2 | Polishing conditions 3 | Polishing conditions 4 |
| 5 | 5 | 8 | 15 | 20 |
| 10 | 6 | 8 | 20 | 31 |
| 15 | 7 | 13 | 22 | 39 |
| 20 | 6 | 15 | 30 | 47 |
| 25 | 5 | 19 | 34 | 55 |
| 30 | 7 | 23 | 41 | 67 |
| 35 | 6 | 25 | 48 | 74 |
| 40 | 5 | 27 | 58 | 78 |
| 45 | 7 | 31 | 62 | 90 |
| 50 | 6 | 35 | 68 | 105 |

Comparative Example

A silicon wafer was evaluated by the method for evaluation by the SC1-RT method disclosed in Japanese Unexamined Patent Application Publication No. 2000-208578. Specifically, using a treatment solution including ammonia, hydrogen peroxide, and water, an etching treatment was performed on a silicon wafer surface and defects were detected. However, what were detected in this treatment were mainly particles and crystal defects as shown in FIG. 3 (B). In addition, even when a Surfscan SP5 manufactured by KLA-Tencor was used, at a particle size of 19 nm or more, surface roughness was degraded, and measurement was impossible.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A method for evaluating a silicon wafer, comprising:
an initial surface defect measuring step of performing a surface defect measurement on the silicon wafer,
a cleaning step of alternately repeating on the first surface of the silicon wafer an oxidation treatment by ozone water and an oxide film removal treatment by hydrofluoric acid, wherein each oxide film removal treatment by hydrofluoric acid performed in the cleaning step involves not completely removing oxide film formed on the first surface of the silicon wafer, and
an incremental defect measuring step of performing a surface defect measurement on the silicon wafer after the cleaning step and measuring incremental defects that increased relative to defects measured in the initial surface defect measuring step, wherein
the cleaning step and the incremental defect measuring step are alternatively performed repeatedly multiple times and the silicon wafer is evaluated based on a measurement result of the incremental defects.

2. The method for evaluating a silicon wafer according to claim 1, wherein each oxide film removal treatment by hydrofluoric acid is performed with a hydrofluoric acid concentration of 0.1 to 1.0% and a treatment time of 2 seconds to 20 seconds.

3. The method for evaluating a silicon wafer according to claim 1, wherein each cleaning step is performed by repeating the oxidation treatment by ozone water and the oxide film removal treatment by hydrofluoric acid alternately 5 times or more.

4. The method for evaluating a silicon wafer according to claim 3, wherein each cleaning step is performed by repeating the oxidation treatment by ozone water and the oxide film removal treatment by hydrofluoric acid alternately 5 times or more.

5. The method for evaluating a silicon wafer according to claim 1, wherein as the silicon wafer, a mirror-polished wafer is used.

6. The method for evaluating a silicon wafer according to claim 2, wherein as the silicon wafer, a mirror-polished wafer is used.

7. The method for evaluating a silicon wafer according to claim 3, wherein as the silicon wafer, a mirror-polished wafer is used.

8. The method for evaluating a silicon wafer according to claim 4, wherein as the silicon wafer, a mirror-polished wafer is used.

9. The method for evaluating a silicon wafer according to claim 1, wherein defects of the silicon wafer due to processing are evaluated based on a measurement result of the incremental defects after each of the cleaning steps.

10. The method for evaluating a silicon wafer according to claim 2, wherein defects of the silicon wafer due to processing are evaluated based on a measurement result of the incremental defects after each of the cleaning steps.

11. The method for evaluating a silicon wafer according to claim 3, wherein defects of the silicon wafer due to processing are evaluated based on a measurement result of the incremental defects after each of the cleaning steps.

12. The method for evaluating a silicon wafer according to claim 4, wherein defects of the silicon wafer due to processing are evaluated based on a measurement result of the incremental defects after each of the cleaning steps.

13. The method for evaluating a silicon wafer according to claim 5, wherein defects of the silicon wafer due to processing are evaluated based on a measurement result of the incremental defects after each of the cleaning steps.

14. The method for evaluating a silicon wafer according to claim 6, wherein defects of the silicon wafer due to processing are evaluated based on a measurement result of the incremental defects after each of the cleaning steps.

15. The method for evaluating a silicon wafer according to claim 7, wherein defects of the silicon wafer due to processing are evaluated based on a measurement result of the incremental defects after each of the cleaning steps.

16. The method for evaluating a silicon wafer according to claim 8, wherein defects of the silicon wafer due to processing are evaluated based on a measurement result of the incremental defects after each of the cleaning steps.

17. A method for manufacturing a silicon wafer that is to become a product, comprising:
a step of performing mirror-polishing on an experimental silicon wafer,
an initial surface defect measuring step for performing a surface defect measurement on the experimental silicon wafer,
a cleaning step of alternately repeating on a first surface of the experimental silicon wafer an oxidation treatment by ozone water and an oxide film removal treatment by hydrofluoric acid, wherein each oxide film removal treatment by hydrofluoric acid performed in the cleaning step involves not completely removing oxide film formed on the first surface of the experimental silicon wafer, and
an incremental defect measuring step of performing a surface defect measurement on the experimental silicon wafer after the cleaning step and measuring incremental defects that increased relative to defects measured in the initial surface defect measuring step, wherein
the cleaning step and the incremental defect measuring step are alternately performed repeatedly multiple times and the experimental silicon wafer is evaluated based on a measurement result of the incremental defects,
on the basis of the evaluation of the experimental silicon wafer, mirror-polishing conditions are specified, and
the silicon wafer that is to be become a product is manufactured by performing mirror-polishing on the silicon wafer that is to become a product under the specified mirror-polishing conditions.

* * * * *